(12) United States Patent
Park et al.

(10) Patent No.: US 8,780,656 B2
(45) Date of Patent: Jul. 15, 2014

(54) STACKED MEMORY DEVICE AND METHOD OF REPAIRING SAME

(75) Inventors: Chul-Woo Park, Yongin-si (KR);
Hong-Sun Hwang, Suwon-si (KR);
Sang-Beom Kang, Hwaseong-si (KR);
Won-Seok Lee, Suwon-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 673 days.

(21) Appl. No.: 13/015,847

(22) Filed: Jan. 28, 2011

(65) Prior Publication Data
US 2011/0228581 A1    Sep. 22, 2011

(30) Foreign Application Priority Data

Mar. 18, 2010  (KR) .................. 10-2010-0024405

(51) Int. Cl.
*G11C 7/00*    (2006.01)
*G11C 5/02*    (2006.01)
(52) U.S. Cl.
USPC ........................................... 365/200; 365/51

(58) Field of Classification Search
USPC ....................... 365/200, 51; 257/686, 777
See application file for complete search history.

(56) References Cited

U.S. PATENT DOCUMENTS

| 6,469,375 | B2 * | 10/2002 | Beausoleil et al. ........... 257/686 |
| 6,781,896 | B2 | 8/2004 | Lammers et al. |
| 7,212,422 | B2 * | 5/2007 | Koide ............................. 365/51 |
| 7,315,480 | B2 * | 1/2008 | Lee et al. ...................... 365/200 |
| 7,936,622 | B2 * | 5/2011 | Li et al. ......................... 365/200 |
| 2008/0198646 | A1 | 8/2008 | Park et al. |
| 2009/0180339 | A1 | 7/2009 | Kim et al. |

FOREIGN PATENT DOCUMENTS

| JP | 2009170082 A | 7/2009 |
| KR | 100819005 B1 | 3/2008 |
| KR | 1020090078628 A | 7/2009 |

* cited by examiner

*Primary Examiner* — Tuan T Nguyen
(74) *Attorney, Agent, or Firm* — Volentine & Whitt, PLLC

(57) ABSTRACT

A stacked semiconductor memory device comprises memory cell array layers that are stacked in an inverted wedge shape and have different redundancy sizes from each other. The stacked semiconductor memory device has space for vertical connection between layers, a relatively small size, and a relatively high yield.

20 Claims, 11 Drawing Sheets

STACKED MEMORY DEVICE AND METHOD OF REPAIRING SAME

CROSS-REFERENCE TO RELATED APPLICATIONS

This application claims priority under 35 U.S.C. §119 to Korean Patent Application No. 10-2010-0024405 filed on Mar. 18, 2010, the disclosure of which is hereby incorporated by reference in its entirety.

BACKGROUND

Embodiments of the inventive concept relate generally to semiconductor memory devices. More particularly, embodiments of the inventive concept relate to semiconductor memory devices having a stacked structure.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM). Examples of nonvolatile memory devices include phase-change RAM (PRAM), resistive RAM (RRAM), magnetic RAM (MRAM), and electrically erasable programmable read only memory (EEPROM).

Nonvolatile memory devices have gained increasing popularity in recent years due to a variety of trends, such as the increasing demand for long term data storage and the proliferation of mobile devices that need to retain stored data when disconnected from power.

Some nonvolatile memory devices store data using variable resistance elements that change between different resistive states to represent different data values. Such nonvolatile memory devices are referred to as resistive memory devices. A resistive memory device typically comprises a plurality of unit memory cells each comprising a variable resistive element and a switching element. The variable resistive element is connected between a bit line and the switching element, and the switching element is typically connected between the variable resistive element and a word line. The unit memory cells are generally arranged in a memory cell array connected to a plurality of word lines and bit lines.

Examples of resistive memory devices include PRAM, RRAM, and MRAM. In a PRAM, the variable resistance element comprises a phase-change material such as chalcogenide that changes resistance in response to an applied temperature. In an RRAM, the variable resistance element comprises an upper electrode, a lower electrode, and a transition metal oxide between the upper and lower electrodes. In an MRAM, the variable resistive element comprises a ferromagnetic upper electrode, a ferromagnetic lower electrode, and a ferromagnetic material between the upper and lower electrodes.

In an effort to improve the performance and storage density of resistive memory devices, researchers have developed resistive memory devices in which memory cell array layers are stacked in a 3-dimensional configuration on a semiconductor substrate.

SUMMARY

Embodiments of the inventive concept provide stacked semiconductor memory devices having memory cell array layers stacked in an inverted wedge shape and having different amounts of redundant data storage. Embodiments of the inventive concept also provide memory systems comprising the stacked semiconductor memory devices. Embodiments of the inventive concept also provide methods of repairing stacked semiconductor memory devices.

According to one embodiment of the inventive concept, a stacked semiconductor memory device comprises a semiconductor substrate and a plurality of memory cell array layers stacked on the semiconductor substrate. The plurality of memory cell array layers increase in area as they increase in distance from the semiconductor substrate, and wherein the memory cell array layers provide different amounts of redundant data storage.

In certain embodiments, the plurality of memory cell array layers have normal cell array regions with the same size as each other, and the plurality of memory cell array layers have redundant cell array regions that increase in size as a distance from the semiconductor substrate increases.

In certain embodiments, the memory cell array layers have redundant cell array regions that occupy a proportionally larger area of each memory cell array layer as a distance from the semiconductor substrate increases.

In certain embodiments, redundant cell array regions are disposed in a portion of the memory cell array layers having an inverted wedge shape.

In certain embodiments, the memory cell array layers have an inverted wedge shape in a left outer portion or in a right outer portion relative to a center of the memory cell array layers.

In certain embodiments, redundant cell array regions are disposed in the left outer portion or in the right outer portion.

In certain embodiments, the memory cell array layers have an inverted wedge shape in a left outer portion and in a right outer portion relative to a center of the memory cell array layers.

In certain embodiments, the memory cell array layers have an inverted wedge shape in a left outer portion and in a bottom outer portion relative to a center of the memory cell array layers.

In certain embodiments, the memory cell array layers have an inverted wedge shape in a left outer portion, in a right outer portion, in a lower outer portion and in an upper outer portion relative to a center of the memory cell array layers.

In certain embodiments, each of the memory cell array layers comprises a plurality of memory blocks divided by a VIA region in which vertical connection lines are arranged.

In certain embodiments, redundant cell arrays of the same type are disposed on opposite surfaces of two memory blocks divided by the VIA region.

In certain embodiments, layer addresses of memory cell array layers in the same block as a memory cell array layer having a defective cell are substituted with new layer addresses.

In certain embodiments, a layer address of the memory cell array layer having the defective cell is substituted with a most significant address.

In certain embodiments, each of the new layer addresses is generated by performing an exclusive NOR operation on one of the memory cell array layers and an address of the memory cell array layer having the defective cell.

In certain embodiments, a block redundant cell array region for repairing the memory cell array layer having the defective cell is disposed in a peripheral region of each of the memory cell array layers.

In certain embodiments, the stacked semiconductor memory device further comprises a memory controller configured to generate address signals and command signals, wherein the memory cell array layers store received data or output stored data based on the address signals and the command signals.

According to another embodiment of the inventive concept, a method of repairing a stacked semiconductor memory device comprises repairing defective cells using a redundant row memory cell array and a redundant column memory cell array, and substituting layer addresses of memory cell array layers belonging to the same block as a memory cell array layer having a defective cell with new layer addresses.

In certain embodiments, substituting layer addresses of memory cell array layers with new layer addresses comprises performing an exclusive NOR operation on each address of the memory cell array layers and an address of the memory cell array layer having the defective cell.

In certain embodiments, the defective cells are repaired using a redundant cell array in a first memory cell array where the defective cell is located in the first memory cell array.

According to another embodiment of the inventive concept, a method of repairing a stacked semiconductor memory device comprises repairing defective cells using a redundant row memory cell array and a redundant column memory cell array, and repairing a memory cell array layer having a defective cell by substituting the memory cell array layer with a redundant layer disposed in a peripheral region of a cell array region.

BRIEF DESCRIPTION OF THE DRAWINGS

The drawings illustrate selected embodiments of the inventive concept. In the drawings, like reference numbers indicate like features.

DETAILED DESCRIPTION OF THE EMBODIMENTS

Figure 1:
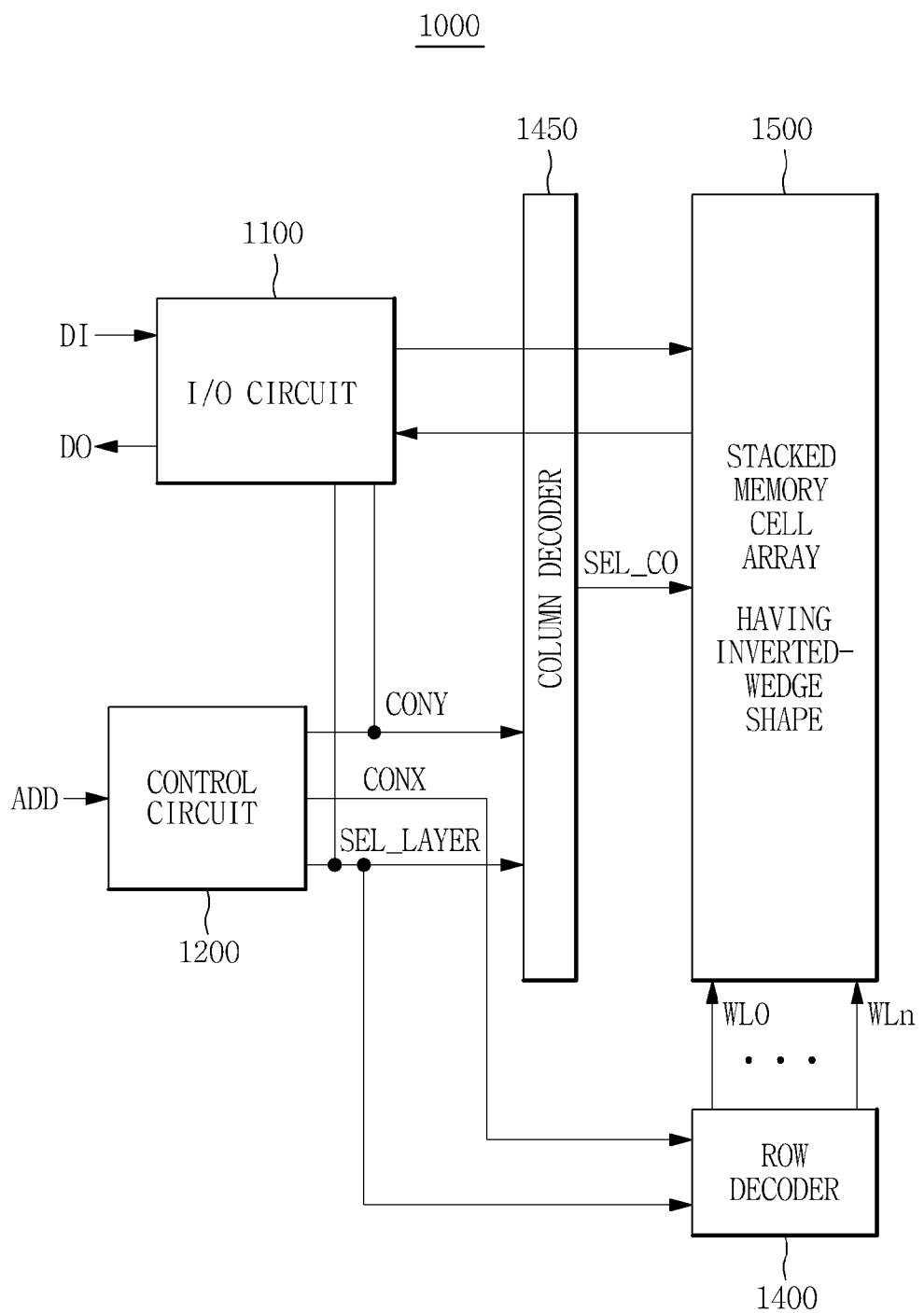
FIG. 1 is a block diagram illustrating a stacked semiconductor memory device according to an embodiment of the inventive concept.

Embodiments of the inventive concept are described below with reference to the accompanying drawings. These embodiments are presented as teaching examples and should not be construed to limit the scope of the inventive concept.

In the description that follows, where a feature is referred to as being "on," "connected to," or "coupled to" another feature, it can be directly on, connected or coupled to the other feature or intervening features may be present. In contrast, where a feature is referred to as being "directly on," "directly connected to," or "directly coupled to" another feature, there are no intervening features present. The term "and/or" indicates any and all combinations of one or more of the associated listed items.

Although the terms first, second, third, etc., are used herein to describe various features, these features should not be limited by these terms. Rather, these terms are only used to distinguish one feature from another. Accordingly, a first feature discussed below could be termed a second feature without departing from the scope of the inventive concept.

Spatially relative terms, such as "beneath," "below," "lower," "above," "upper" and the like, may be used to describe spatial relationships between different features. These terms, however, are intended to encompass different orientations of the device in addition to those depicted in the figures. For example, where a device in the figures is turned over, elements described as "below" or "beneath" other elements or features would then be oriented "above" the other elements or features. Thus, the term "below" can encompass both an orientation of above and below. A device may be otherwise oriented (e.g., rotated 90 degrees or at other orientations), with spatially relative descriptors interpreted accordingly.

The terminology used herein is for the purpose of describing particular embodiments only and is not intended to limit the inventive concept. The singular forms "a," "an" and "the" are intended to include plural forms as well, unless the context clearly indicates otherwise. The terms "comprises" and/or "comprising," when used in this specification, specify the presence of stated features, but do not preclude additional features.

Embodiments are described with reference to cross-sectional illustrations of idealized embodiments. As such, variations from the shapes of the illustrations are to be expected due to variations in manufacturing processes and other variables. Accordingly, embodiments should not be construed as limited to the particular shapes illustrated herein. As an example, an implanted region illustrated as a rectangle will typically have rounded or curved features and/or a gradient of implant concentration at its edges rather than a binary change from an implanted to a non-implanted region. Similarly, the formation of buried region by implantation may result in some implantation in a region between the buried region and a surface through which the implantation takes place.

Unless otherwise defined, all terms (including technical and scientific terms) used herein have the same meaning as commonly understood by one of ordinary skill in the art. Terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a block diagram illustrating a stacked semiconductor memory device 1000 according to an embodiment of the inventive concept.

Referring to FIG. 1, stacked semiconductor memory device 1000 comprises an input/output circuit 1100, a control circuit 1200, a row decoder 1400, a column decoder 1450, and a stacked memory cell array 1500.

Control circuit 1200 sets program modes of memory cell array layers based on address signals ADD and program information, controls timing and voltage levels of address signals ADD to generate a row control signal CONX and a column control signal CONY, and generates a layer selecting signal SEL_LAYER based on row control signal CONX and column control signal CONY.

Row decoder 1400 decodes row control signal CONX and layer selecting signal SEL_LAYER to generate word-line driving signals WL0 through WLn and provides word-line driving signals WL0 through WLn to stacked memory cell array 1500. Column decoder 1450 decodes column control signal CONY and layer selecting signal SEL_LAYER to generate a column selecting signal SEL_CO and provides column selecting signal SEL_CO to stacked memory cell array 1500.

Input/output circuit 1100 comprises a sense amplifier and a write driving circuit and provides input data DI to stacked memory cell array 1500 in response to column control signal CONY and layer selecting signal SEL_LAYER in a write operation mode. Input/output circuit 1100 senses and amplifies a voltage of a bit-line to generate output data DO in response to column control signal CONY and layer selecting signal SEL_LAYER in a read operation mode.

Stacked memory cell array 1500 has an inverted wedge shape and comprises a plurality of memory cell array layers having different amounts of redundant data storage. The inverted wedge shape results from upper layers extending farther than lower layers in a lateral direction.

Figure 2:
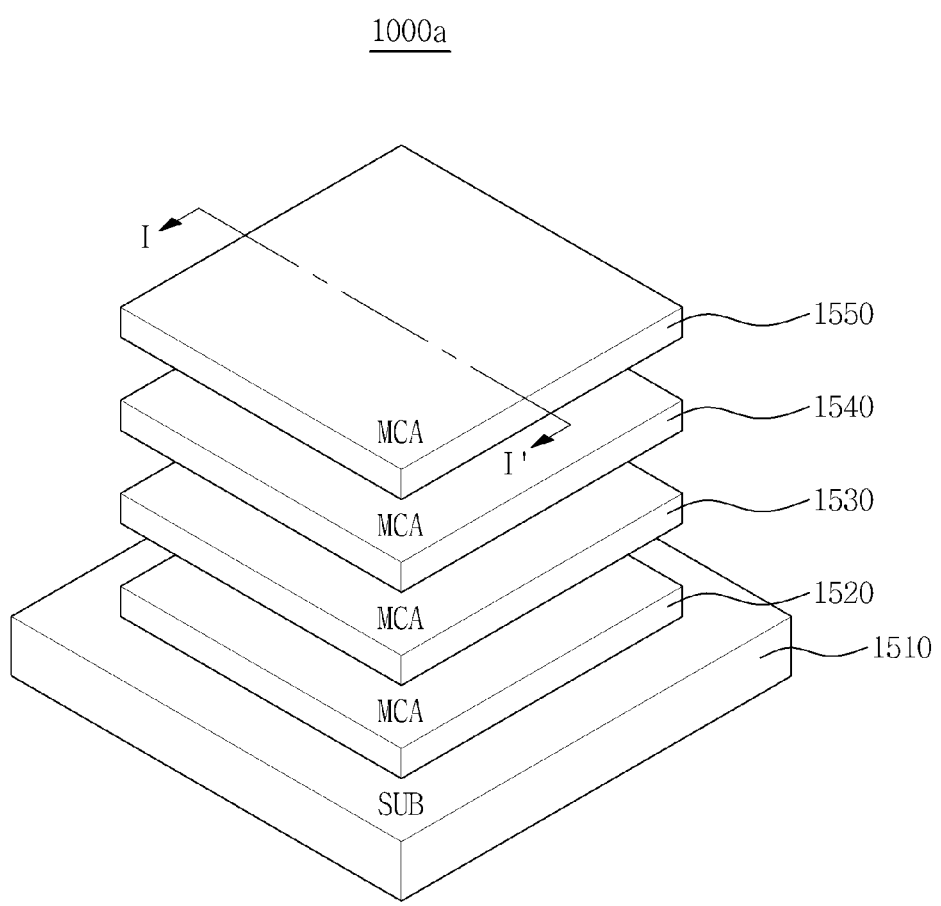
FIG. 2 is a perspective view illustrating a three-dimensional structure of the stacked semiconductor memory device of FIG. 1.

FIG. 2 is a perspective view illustrating a three-dimensional structure of stacked semiconductor memory device 1000 of FIG. 1.

Referring to FIG. 2, stacked semiconductor memory device 1000a comprises a semiconductor substrate 1510 and memory cell array layers 1520, 1530, 1540, and 1550.

Semiconductor substrate 1510 comprises functional circuits such as a decoder, a controller, and so on. Memory cell array layers 1520, 1530, 1540, and 1550 are stacked on semiconductor substrate 1510 in an inverted wedge shape, and they have different redundancy sizes from each other. In other words, memory cell array layers 1520, 1530, 1540, and 1550 provide different amounts of redundant data storage.

Stacked memory cell array 1500 of FIG. 1 comprises memory cell array layers 1520, 1530, 1540, and 1550 of FIG. 2. Input/output circuit 1100, control circuit 1200, row decoder 1400, and column decoder 1450 of FIG. 1 are formed in semiconductor substrate 1510 of FIG. 2.

Figure 3:
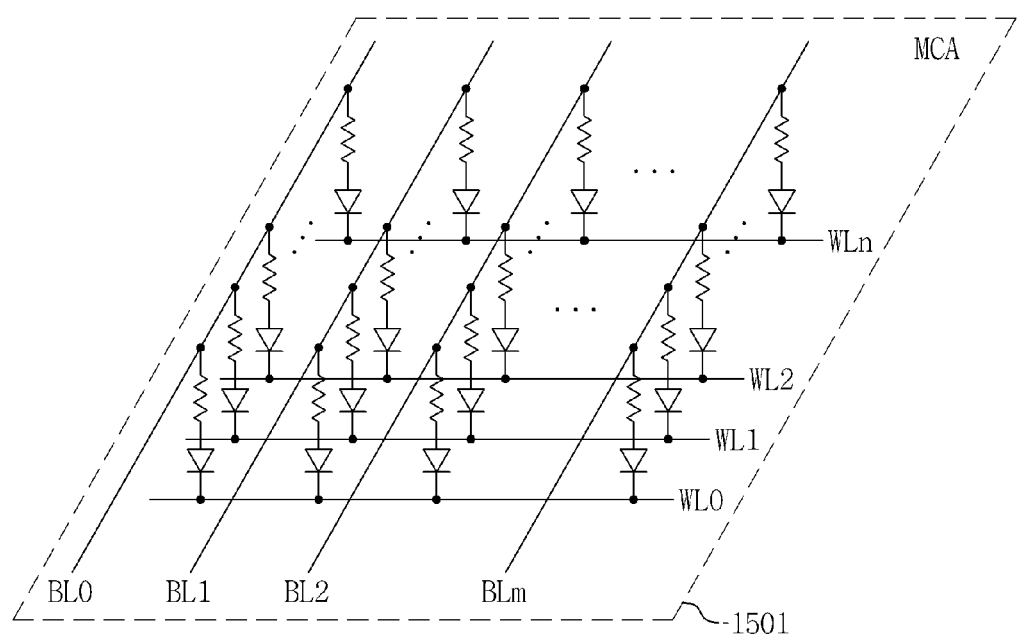
FIG. 3 is a circuit diagram illustrating an example memory cell array layer in the stacked semiconductor memory device of FIG. 2.

FIG. 3 is a circuit diagram illustrating an example memory cell array layer in the stacked semiconductor memory device of FIG. 2.

Referring to FIG. 3, bit-lines BL0 through BLm and word-lines WL0 through WLn are arranged in a memory cell array (MCA) layer 1501. MCA layer 1501 has a cross-point structure, and memory cells are located at cross-points or intersections of bit-lines BL0 through BLm and word-lines WL0 through WLn. Each of the memory cells shown in FIG. 3 comprises a resistive device and a diode connected to each other in series.

Figure 4:
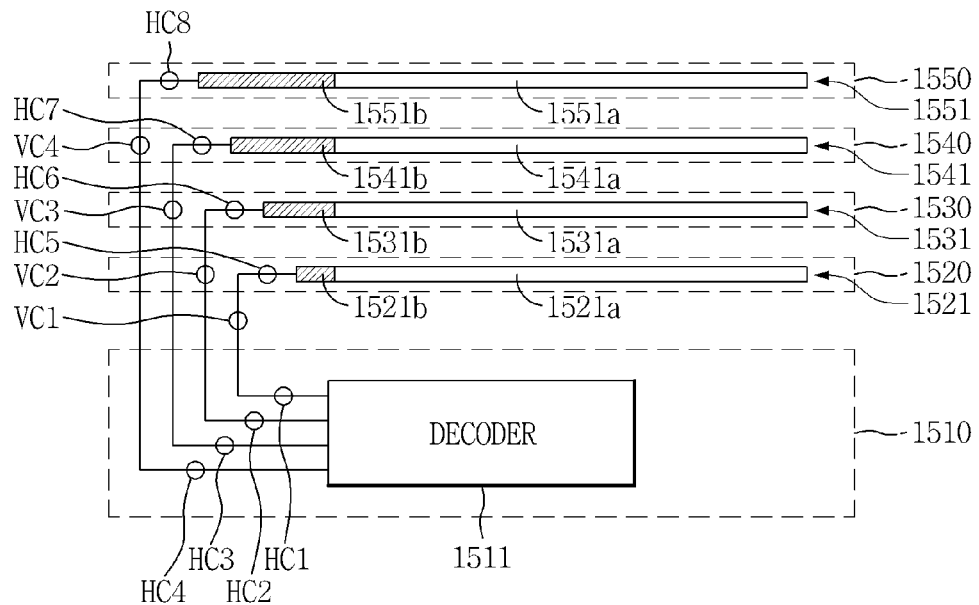
FIG. 4 is a cross-sectional view taken along a line I-I' in the stacked semiconductor memory device of FIG. 2.

FIG. 4 is a cross-sectional view taken along a line I-I' in stacked semiconductor memory device 1000a of FIG. 2. The cross-sectional view of FIG. 4 illustrates an example of a vertical structure of stacked semiconductor memory device 1000a.

Referring to FIG. 4, stacked semiconductor memory device 1000b comprises semiconductor substrate 1510 and memory cell array layers 1520, 1530, 1540, and 1550.

Semiconductor substrate 1510 comprises a decoder 1511, memory cell array layer 1520 comprises a cell array region 1521, and memory cell array layer 1530 comprises a cell array region 1531. Memory cell array layer 1540 comprises a cell array region 1541, and memory cell array layer 1550 comprises a cell array region 1551. Memory cell array layers 1520, 1530, 1540, and 1550 are stacked on semiconductor substrate 1510.

Cell array region 1521 comprises a normal cell array region 1521a and a redundant cell array region 1521b, and cell array region 1531 comprises a normal cell array region 1531a and a redundant cell array region 1531b. Cell array region 1541 comprises a normal cell array region 1541a and a redundant cell array region 1541b, and cell array region 1551 comprises a normal cell array region 1551a and a redundant cell array region 1551b.

Stacked semiconductor memory device 1000b electrically connects memory cell selecting lines arranged in each of memory cell array layers 1520, 1530, 1540, and 1550 to decoder 1511 formed in semiconductor substrate 1510 through horizontal connection lines and vertical connection lines.

Memory cell selecting lines in cell array region 1521 are electrically connected to decoder 1511 formed on semiconductor substrate 1510 through a horizontal connection line HC1, a vertical connection line VC1, and a horizontal connection line HC5. Memory cell selecting lines in cell array region 1531 are electrically connected to decoder 1511 formed in semiconductor substrate 1510 through a horizontal connection line HC2, a vertical connection line VC2, and a horizontal connection line HC6.

Memory cell selecting lines in cell array region 1541 are electrically connected to decoder 1511 formed in semiconductor substrate 1510 through a horizontal connection line HC3, a vertical connection line VC3, and a horizontal connection line HC7. Memory cell selecting lines in cell array region 1551 are electrically connected to decoder 1511 formed in semiconductor substrate 1510 through a horizontal connection line HC4, a vertical connection line VC4, and a horizontal connection line HC8.

Vertical connection lines VC21, VC22, VC23, VC25, and VC26 typically each comprise a plurality of lines and are formed using a VIA process.

Horizontal connection lines HC1, HC2, HC3, and HC4 are formed in semiconductor substrate 1510, and horizontal connection line HC6 is formed in memory cell array layer 1530. Horizontal connection line HC7 is formed in memory cell array layer 1540, and horizontal connection line HC8 is formed in memory cell array layer 1550.

In stacked semiconductor memory device 1000*b* of FIG. 4, memory cell array layers 1520, 1530, 1540, and 1550 are stacked on semiconductor substrate 1510 in an inverted wedge shape, and they have different redundancy sizes from each other.

Normal cell array regions 1521*a*, 1531*a*, 1541*a*, and 1551*a* in memory cell array layers 1520, 1530, 1540, and 1550 have the same size as each other, and redundant cell array regions 1521*b*, 1531*b*, 1541*b*, and 1551*b* increase in size as a distance from semiconductor substrate 1510 increases. In addition, redundant cell array regions 1521*b*, 1531*b*, 1541*b* and 1551*b* occupy proportionally larger areas of corresponding memory cell array layers as the distance from semiconductor substrate 1510 increases.

Figure 5:
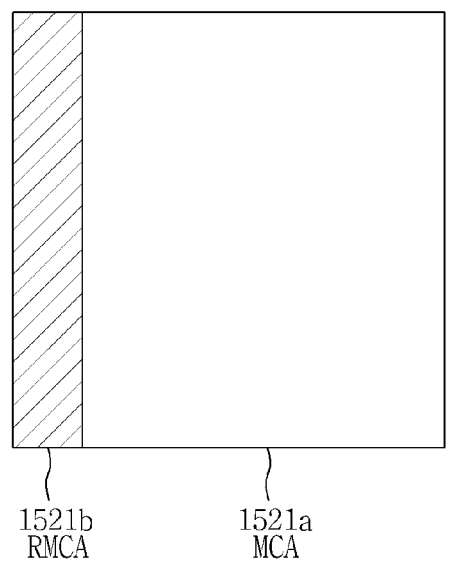
FIG. 5 is a plan view illustrating an example layout of a memory cell array layer in the stacked semiconductor memory device of FIG. 4.

FIG. 5 is a plan view illustrating an example layout of a cell array region in stacked semiconductor memory device 1000*b* of FIG. 4.

Referring to FIG. 5, cell array region 1521 comprises a normal cell array region 1521*a* and a redundant cell array region 1521*b*. In the example of FIG. 5, redundant cell array region 1521*b* is disposed in a left outer portion from a center of memory cell array layer 1520. Redundant cell array region 1521*b* can also be disposed in a right outer portion from a center of memory cell array layer 1520. A portion of stacked semiconductor memory device 1000*b* in which redundant cell array region 1521*b* is formed has an inverted wedge shape.

Figure 6:
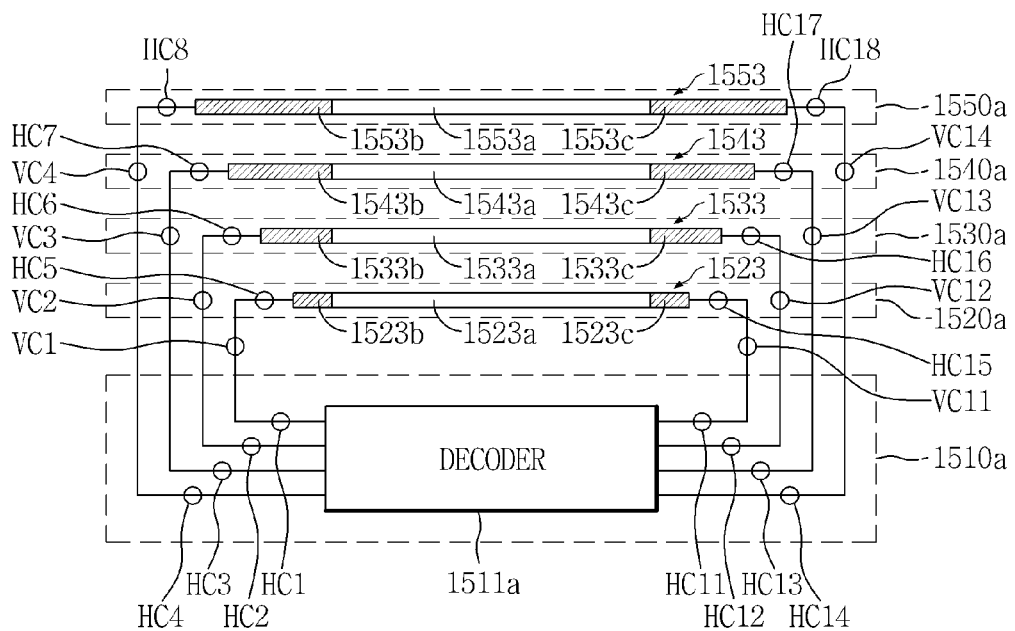
FIG. 6 is a cross-sectional view taken along a line I-I' in the stacked semiconductor memory device of FIG. 2.

FIG. 6 is a cross-sectional view taken along a line I-I' in stacked semiconductor memory device 1000*a* of FIG. 2. The cross-sectional view of FIG. 6 is an example of a vertical structure of stacked semiconductor memory device 1000*a*.

Referring to FIG. 6, a stacked semiconductor memory device 1000*c* comprises a semiconductor substrate 1510*a* and memory cell array layers 1520*a*, 1530*a*, 1540*a*, and 1550*a*.

Semiconductor substrate 1510*a* comprises a decoder 1511*a*. Memory cell array layer 1520*a* comprises a cell array region 1523, and memory cell array layer 1530*a* comprises a cell array region 1533. Memory cell array layer 1540*a* comprises a cell array region 1543, and memory cell array layer 1550*a* comprises a cell array region 1553. Memory cell array layers 1520*a*, 1530*a*, 1540*a*, and 1550*a* are stacked on semiconductor substrate 1510*a*.

Cell array region 1523 comprises a normal cell array region 1523*a* and redundant cell array regions 1523*b* and 1523*c*, and cell array region 1533 comprises a normal cell array region 1533*a* and redundant cell array regions 1533*b* and 1533*c*. Cell array region 1543 comprises a normal cell array region 1543*a* and redundant cell array regions 1543*b* and 1543*c*, and cell array region 1553 comprises a normal cell array region 1553*a* and redundant cell array regions 1553*b* and 1553*c*.

Stacked semiconductor memory device 1000*c* electrically connects memory cell selecting lines arranged in each of memory cell array layers 1520*a*, 1530*a*, 1540*a*, and 1550*a* to decoder 1511*a* through horizontal connection lines and vertical connection lines.

Memory cell selecting lines in cell array region 1523 are electrically connected to decoder 1511*a* through horizontal connection lines HC1, HC11, HC5, and HC15 and vertical connection lines VC1 and VC11. Memory cell selecting lines in cell array region 1533 are electrically connected to decoder 1511*a* through horizontal connection lines HC2, HC12, HC6, and HC16 and vertical connection lines VC2 and VC12.

Memory cell selecting lines in cell array region 1543 are electrically connected to decoder 1511*a* through horizontal connection lines HC3, HC13, HC7 and HC17 and vertical connection lines VC3 and VC13. Memory cell selecting lines in cell array region 1553 are electrically connected to decoder 1511*a* through horizontal connection lines HC4, HC14, HC8, and HC18 and vertical connection lines VC4 and VC14.

Horizontal connection lines HC1, HC2, HC3, and HC4 and horizontal connection lines HC11, HC12, HC13 and HC14 are formed in semiconductor substrate 1510*a*. Horizontal connection lines HC5 and HC15 are formed in memory cell array layer 1520*a*, and horizontal connection lines HC6 and HC16 are formed in memory cell array layer 1530*a*. Horizontal connection lines HC7 and HC17 are formed in memory cell array layer 1540*a*, and horizontal connection lines HC8 and HC18 are formed in memory cell array layer 1550*a*.

In stacked semiconductor memory device 1000*c* of FIG. 6, memory cell array layers 1520*a*, 1530*a*, 1540*a*, and 1550*a* are stacked above semiconductor substrate 1510*a* in an inverted wedge shape, and they have different redundancy sizes from each other.

Normal cell array regions 1523*a*, 1533*a*, 1543*a*, and 1553*a* in each of memory cell array layers 1520*a*, 1530*a*, 1540*a*, and 1550*a* have the same size as each other, and redundant cell array regions 1523*b*, 1533*b*, 1543*b*, and 1553*b* and redundant cell array regions 1523*c*, 1533*c*, 1543*c* and 1553*c* increase in size as a distance from semiconductor substrate 1510*a* increases. In addition, redundant cell array regions 1523*c*, 1533*c*, 1543*c*, and 1553*c* occupy proportionally larger areas of corresponding memory cell array layers as a distance from semiconductor substrate 1510*a* increases.

Figure 7:
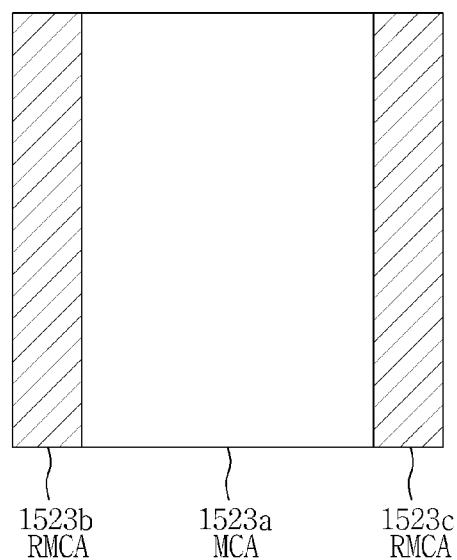
FIG. 7 is a plan view illustrating an example layout of a memory cell array layer in the stacked semiconductor memory device of FIG. 6.

FIG. 7 is a plan view illustrating an example layout of a memory cell array layer in stacked semiconductor memory device 1000*c* of FIG. 6.

Referring to FIG. 7, cell array region 1523 comprises a normal cell array region 1523*a* and redundant cell array regions 1523*b* and 1523*c*. In the example of FIG. 7, redundant cell array regions 1523*b* and 1523*c* are disposed in a left outer portion and in a right outer portion from a center of memory cell array layer 1520*a*. The portions of stacked semiconductor memory device 1000*c* in which redundant cell array regions 1523*b* and 1523*c* are formed have an inverted wedge shape.

Figure 8:
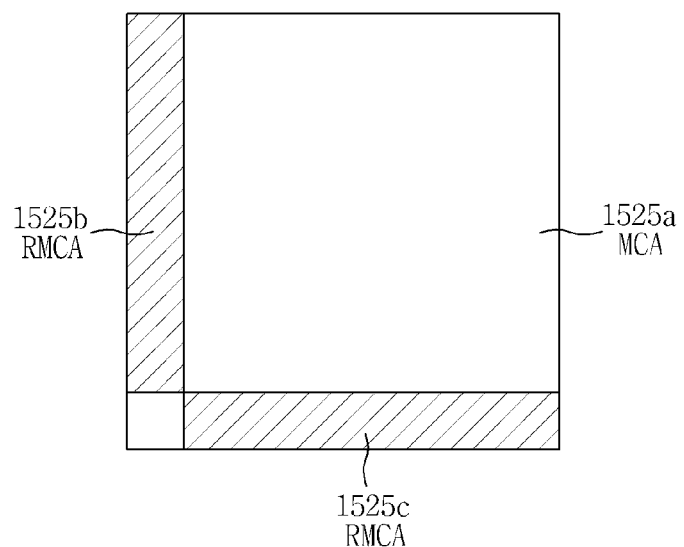
FIGS. 8 and 9 are plan views illustrating example layouts of memory cell array layers in the stacked semiconductor memory device of FIG. 2.
Figure 9:
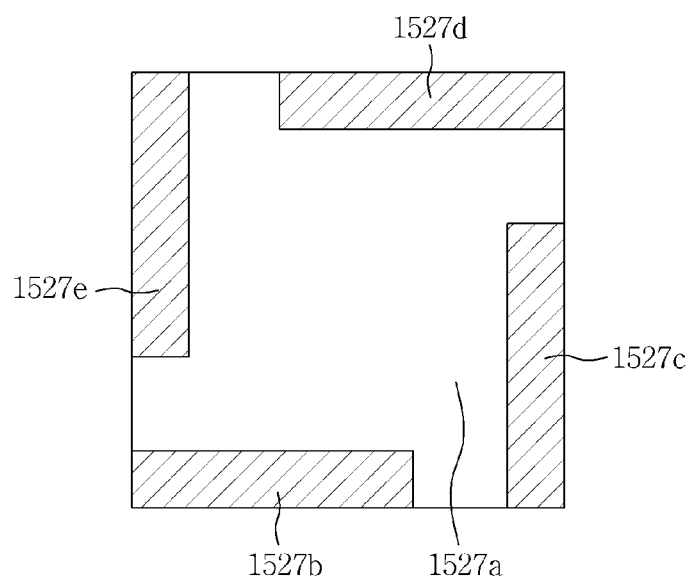

FIGS. 8 and 9 are plan views illustrating example layouts of a memory cell array layer included in stacked semiconductor memory device 1000*a* of FIG. 2.

Referring to FIG. 8, cell array region 1525 comprises a normal cell array region 1525*a* and redundant cell array regions 1525*b* and 1525*c*. In the example of FIG. 8, redundant cell array regions 1525*b* and 1525*c* are disposed in a left outer portion and in a bottom outer portion from a center of a memory cell array layer. The portions in which redundant cell array regions 1525*b* and 1525*c* are formed have an inverted wedge shape. Redundant cell array regions 1525*b* and 1525*c* can also be disposed in a right outer portion and a top outer portion from a center of the memory cell array layer.

Referring to FIG. 9, cell array region 1527 comprises a normal cell array region 1527*a* and redundant cell array regions 1527*b*, 1527*c*, 1527*d*, and 1527*e*. In the example of FIG. 9, redundant cell array regions 1527*b*, 1527*c*, 1527*d*, and 1527*e* are disposed in a left outer portion, in a right outer portion, in a bottom outer portion, and in a top outer portion from a center of the memory cell array layer. The portions in which redundant cell array regions 1527*b*, 1527*c*, 1527*d*, and 1527*e* are formed have an inverted wedge shape.

Figure 10:
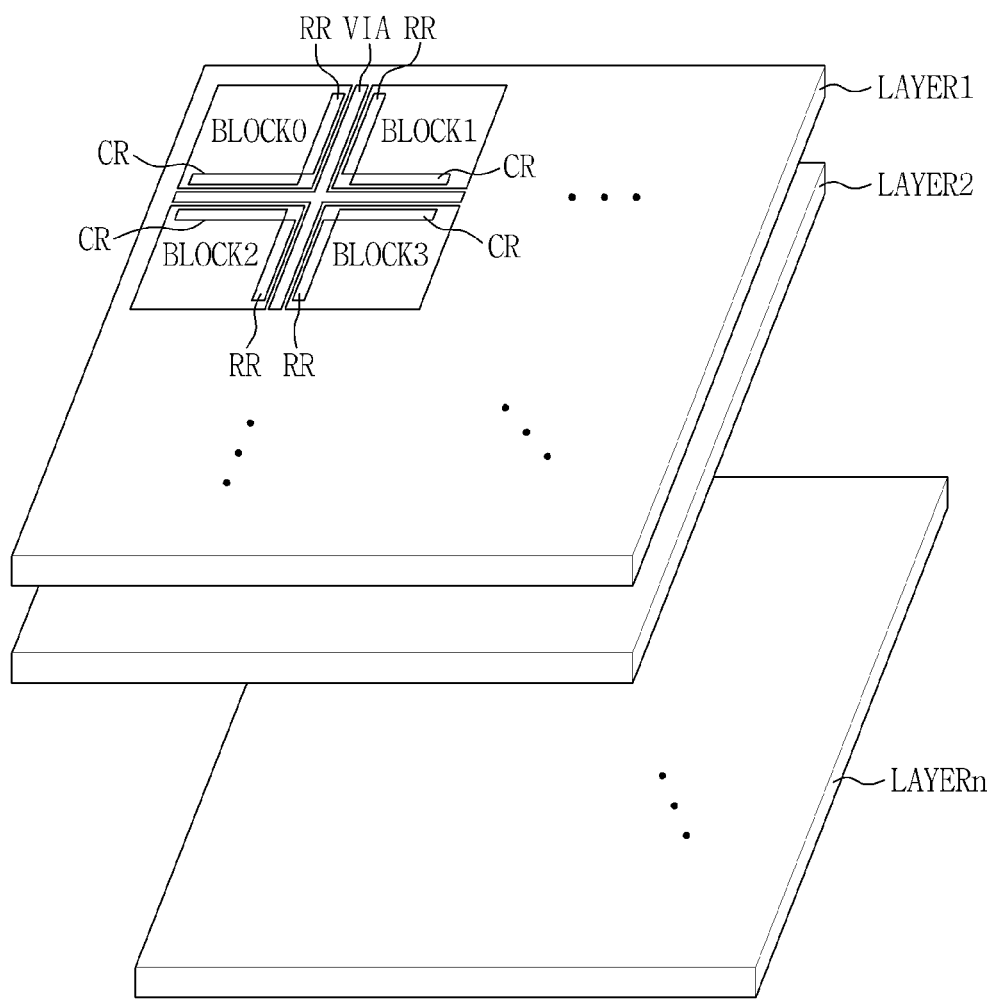
FIG. 10 is a perspective view illustrating an example layout of a redundancy circuit in a stacked semiconductor memory device having memory cell array layers comprising a plurality of blocks.

FIG. 10 is a perspective view illustrating an example layout of a redundancy circuit in a stacked semiconductor memory device having memory cell array layers comprising a plurality of blocks.

Referring to FIG. 10, stacked semiconductor memory device 2000 comprises a plurality of memory cell array layers LAYER1 through LAYERn. Memory cell array layer LAYER1 comprises a plurality of memory blocks divided by a VIA region in which vertical connection lines are arranged. FIG. 10 shows four blocks divided by the VIA region.

The same types of redundant cell arrays are disposed on opposite surfaces of two memory blocks divided by the VIA region. For example, a redundant row memory cell array RR is disposed on a right side of a first memory block BLOCK0 and a left side of a second memory block BLOCK1, and a redundant column memory cell array CR is disposed on a bottom side of a first memory block BLOCK0 and a top side of a third memory block BLOCK2.

Figure 11:
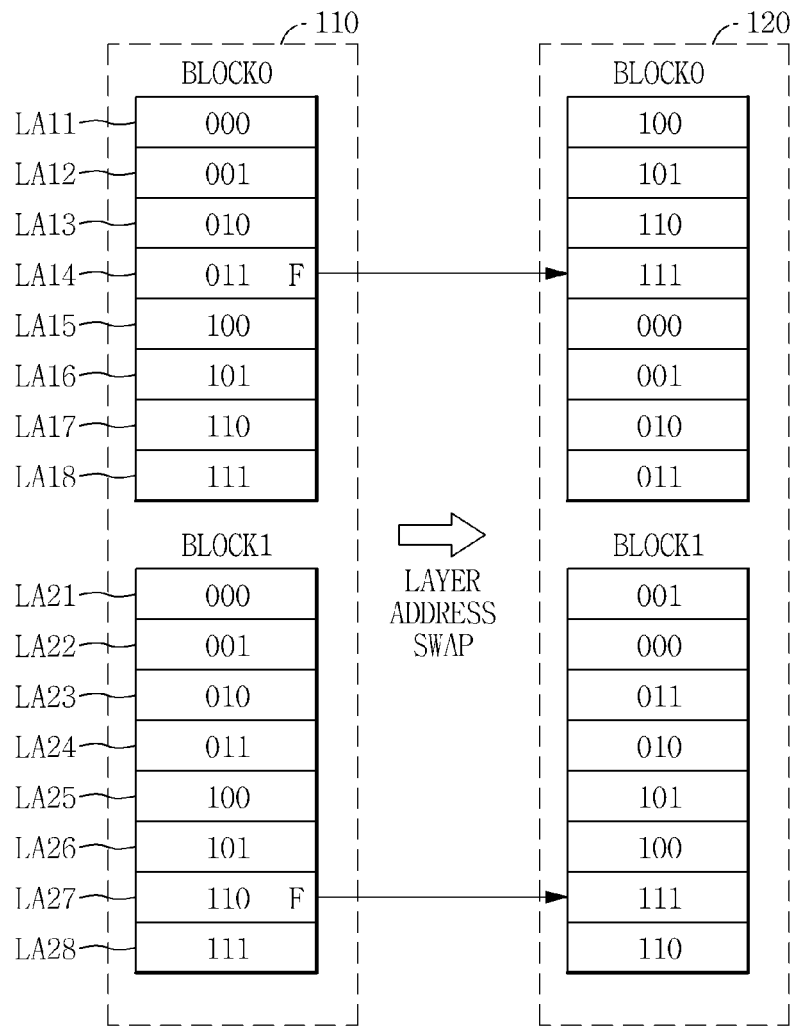
FIG. 11 is a table illustrating a process of layer address swapping for z-address repair according to an embodiment of the inventive concept.
Figure 12:
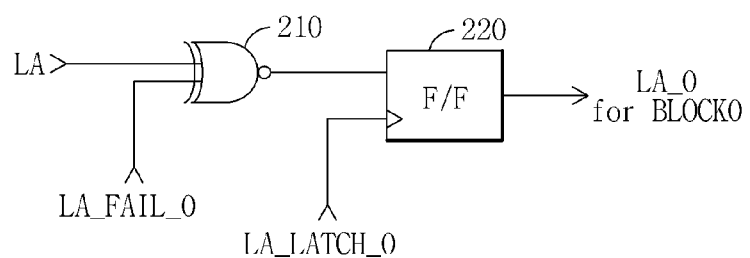
FIG. 12 is a circuit diagram illustrating an example reordering circuit for implementing the layer address swapping of FIG. 11.

FIG. 11 is a table illustrating a process of layer address swapping for z-address repair according to an embodiment of the inventive concept. FIG. 12 is a circuit diagram illustrating an example of a reordering circuit for implementing the layer address swapping shown in FIG. 11.

In FIG. 11, a process of layer address swapping is illustrated with reference to a stacked semiconductor memory device comprising two memory blocks having eight layers. First memory block BLOCK0 comprises memory cell array layers LA11 through LA18, and second memory block BLOCK1 comprises memory cell array layers LA21 through LA28.

A first address table 110 shows address values of first memory block BLOCK0 and second memory block BLOCK1 before layer address swapping is performed. A second address table 120 shows address values of first memory block BLOCK0 and second memory block BLOCK1 after layer address swapping is performed.

For example, before layer address swapping is performed, a layer address of memory cell array layer LA11 of first memory block BLOCK0 is "000", and a layer address of memory cell array layer LA22 of second memory block BLOCK1 is "001". After the layer address swapping is performed, the layer address of memory cell array layer LA11 of first memory block BLOCK0 is "100", and a layer address of memory cell array layer LA22 of second memory block BLOCK1 is "000".

In FIG. 11, a fourth memory cell array layer LA14 of first memory block BLOCK0 and a seventh memory cell array layer LA17 of second memory block BLOCK1 are defective layers. As indicated by FIG. 11, a layer address "011" corresponding to the defective cell of first memory block BLOCK0 and a layer address "110" corresponding to the defective cell of second memory block BLOCK1 are changed into an address "111" after the layer address swapping is performed. That is, an address of a defective memory cell array layer is substituted with a most significant address after the layer address swapping is performed.

Address values of first memory block BLOCK0 and second memory block BLOCK1 after the layer address swapping is performed can be obtained using reordering circuit 200 of FIG. 12.

Referring to FIG. 12, reordering circuit 200 comprises an exclusive NOR (XNOR) gate 210 and a latch circuit 220. Latch circuit 220 typically comprises a flip-flop.

XNOR gate 210 performs an XNOR operation on each address LA of the memory cell array layers and an address LA_FAIL_0 of the memory cell array layer having the defective cell. Latch circuit 220 latches an output signal of XNOR gate 210 in response to a latch control signal LA_LATCH_0 to generate a new layer address LA_0. FIG. 12 shows a circuit for generating new addresses corresponding to layer addresses in first memory block BLOCK0. New addresses corresponding to layer addresses in second memory block BLOCK1 can also be generated using reordering circuit 200 of FIG. 12.

Figure 13:
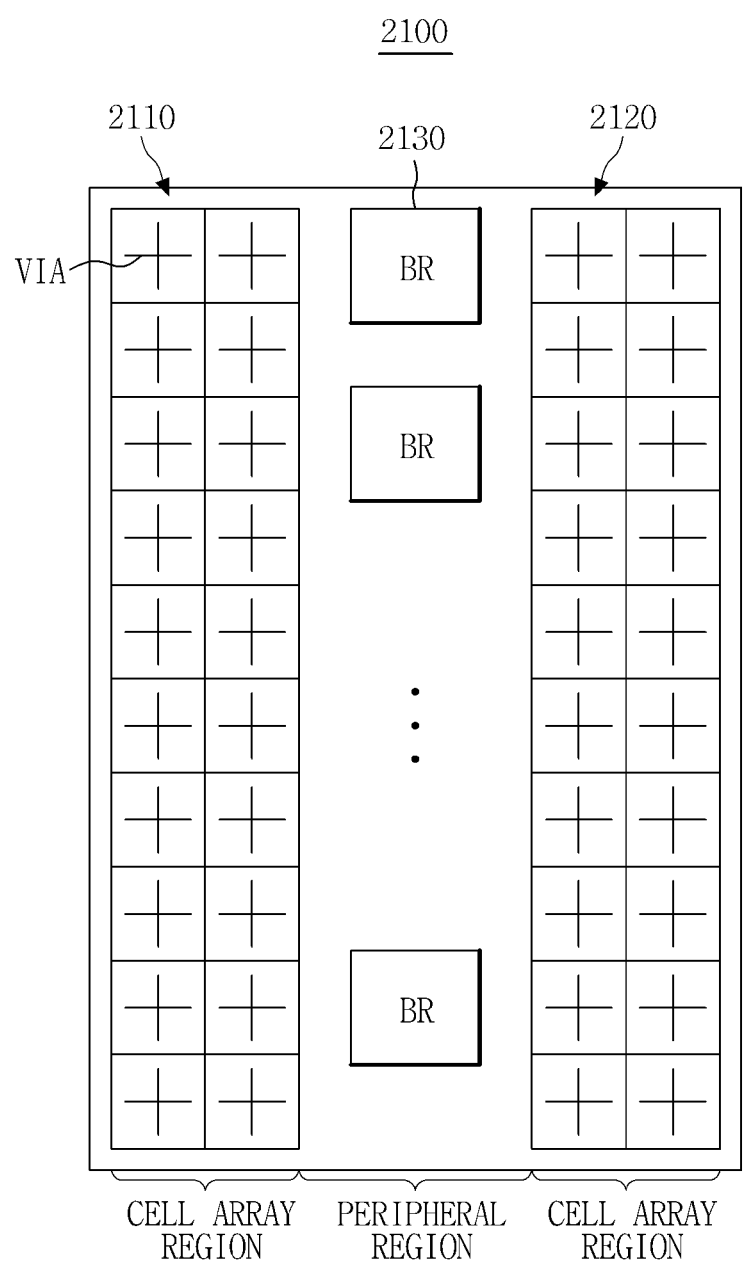
FIG. 13 is a plan view illustrating an example memory cell array layer of a semiconductor memory device having a peripheral region in which block redundant cell arrays are disposed.

FIG. 13 is a plan view illustrating an example memory cell array layer of a semiconductor memory device having a peripheral region in which block redundant cell arrays are disposed.

Referring to FIG. 13, each of the memory cell array layers of stacked semiconductor memory device 2100 comprises cell array regions 2110 and 2120, and block redundant cell array regions BR formed in a peripheral region between cell array region 2110 and cell array region 2120. Cell array regions 2110 and 2120 comprise a plurality of memory blocks divided by VIAs.

Figure 14:
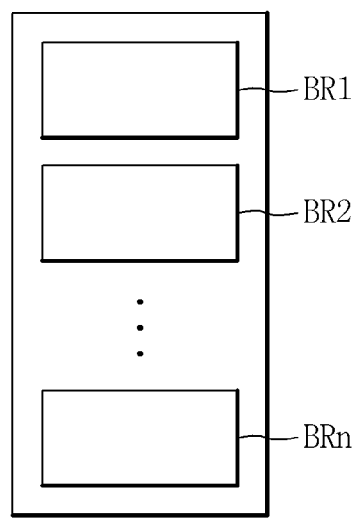
FIG. 14 is a block diagram illustrating an example structure of the block redundant cell arrays shown in FIG. 13.

FIG. 14 is a block diagram illustrating an example structure of the block redundant cell arrays of FIG. 13.

Referring to FIG. 14, a block redundant cell array region 2130 comprises a plurality of redundant memory blocks BR1 through BRn. As examples, redundant memory block BR1 is accessed by the substituted address "111" of first memory block BLOCK0 of FIG. 11, and redundant memory block BR2 is accessed by the substituted address "111" of second memory block BLOCK1 of FIG. 11.

Figure 15:
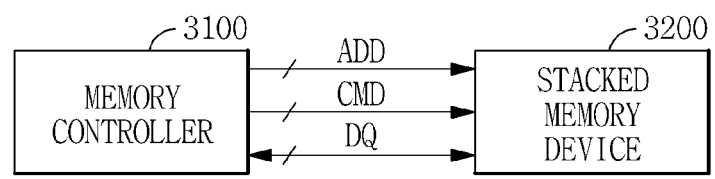
FIG. 15 is a block diagram illustrating an example memory system comprising a stacked semiconductor memory device according to an embodiment of the inventive concept.

FIG. 15 is a block diagram illustrating an example memory system comprising a stacked semiconductor memory device according to an embodiment of the inventive concept.

Referring to FIG. 15, memory system 3000 comprises a memory controller 3100 and a stacked semiconductor memory device 3200.

Memory controller 3100 generates address signals ADD and command signals CMD and provides address signals ADD and command signals CMD to stacked semiconductor memory device 3200 through buses. Data DQ is transmitted from memory controller 3100 to stacked semiconductor memory device 3200 through the buses, or is transmitted from stacked semiconductor memory device 3200 to memory controller 3100 through the buses.

Stacked semiconductor memory device 3200 has a structure of one of the stacked semiconductor memory devices shown in FIG. 1 through FIG. 14, and stores data DQ or outputs stored data based on address signals ADD and command signals CMD. In stacked semiconductor memory device 3200, memory cell array layers are stacked in an inverted wedge shape, and they have different redundancy sizes from each other.

Figure 16:
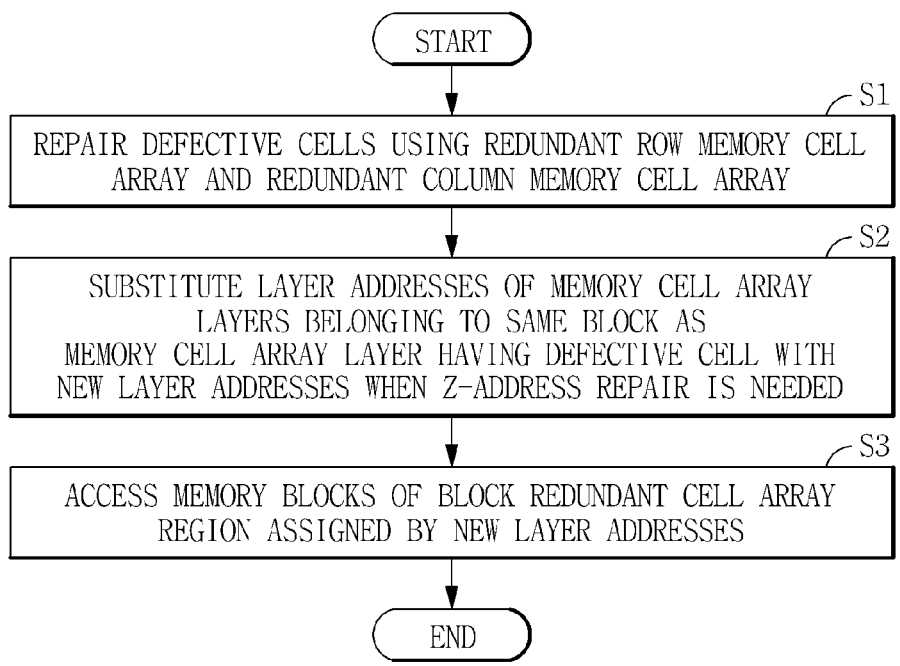
FIG. 16 is a flowchart illustrating a method of repairing a stacked semiconductor memory device according to an embodiment of the inventive concept.

FIG. 16 is a flowchart illustrating a method of repairing a stacked semiconductor memory device according to an embodiment of the inventive concept.

Referring to FIG. 16, the method comprises repairing defective cells using a redundant row memory cell array and a redundant column memory cell array (S1), substituting layer addresses of memory cell array layers belonging to the same block as a memory cell array layer having a defective cell with new layer addresses when z-address repair is needed (S2), and accessing memory blocks of a block redundant cell array region assigned with the new layer addresses (S3).

Figure 17:
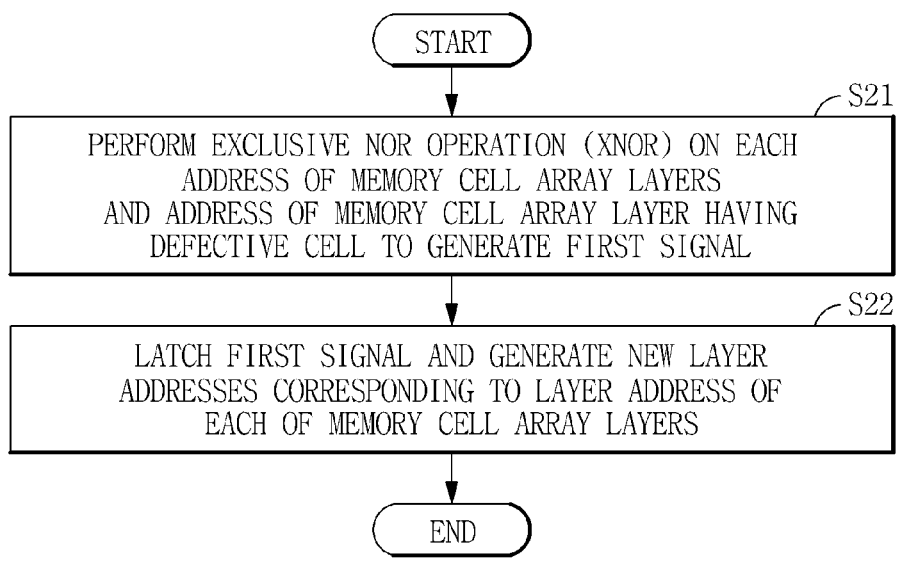
FIG. 17 is a flowchart illustrating a method of substituting layer addresses of memory cell array layers with new layer addresses in the method of FIG. 16.

FIG. 17 is a flowchart illustrating a method of substituting layer addresses of memory cell array layers with new layer addresses in the method of FIG. 16.

Referring to FIG. 17, the method comprises performing an XNOR operation on an address of each of the memory cell array layers and an address of the memory cell array layer having the defective cell to generate a first signal (S21), and latching the first signal to generate a new layer address for each of the memory cell array layers (S22).

An address of a memory cell array layer having a defect can be substituted with a most significant address using the method of FIG. 16.

In the stacked semiconductor memory devices described above, memory cell array layers are stacked in an inverted wedge shape, and redundant cell array regions of the memory cell array layers increase in size as a distance from a semiconductor substrate increases. Accordingly, where a memory cell array layer disposed nearest to the semiconductor substrate has a highest yield, defective cells can be repaired using a redundant cell array in each memory cell array layer. On the other hand, where a memory cell array layer disposed farthest from the semiconductor substrate has a highest yield, defective cells can be repaired by inversely connecting addresses for selecting layers with respect to a row redundant cell array or column redundant cell array. For example, where the stacked semiconductor memory device has eight memory cell array layers, a decoder can generate z-addresses of "000" through "111" for normal cell arrays, and z-addresses of "111" through "000" for redundant cell arrays.

Although various embodiments described above comprise stacked semiconductor memory devices formed with resistive memory cell arrays, the stacked semiconductor memory devices can be modified to use other types of memory cell arrays.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims.

What is claimed is:

1. A stacked semiconductor memory device, comprising:
   a semiconductor substrate; and
   a plurality of memory cell array layers stacked on the semiconductor substrate,
   wherein the plurality of memory cell array layers increase in area as they increase in distance from the semiconductor substrate, and wherein the memory cell array layers provide different amounts of redundant data storage.

2. The stacked semiconductor memory device of claim 1, wherein the plurality of memory cell array layers have normal cell array regions with the same size as each other, and
   wherein the plurality of memory cell array layers have redundant cell array regions that increase in size as a distance from the semiconductor substrate increases.

3. The stacked semiconductor memory device of claim 1, wherein the memory cell array layers have redundant cell array regions that occupy a proportionally larger area of each memory cell array layer as a distance from the semiconductor substrate increases.

4. The stacked semiconductor memory device of claim 1, wherein redundant cell array regions are disposed in a portion of the memory cell array layers having an inverted wedge shape.

5. The stacked semiconductor memory device of claim 1, wherein the memory cell array layers have an inverted wedge shape in a left outer portion or in a right outer portion relative to a center of the memory cell array layers.

6. The stacked semiconductor memory device of claim 5, wherein redundant cell array regions are disposed in the left outer portion or in the right outer portion.

7. The stacked semiconductor memory device of claim 1, wherein the memory cell array layers have an inverted wedge shape in a left outer portion and in a right outer portion relative to a center of the memory cell array layers.

8. The stacked semiconductor memory device of claim 1, wherein the memory cell array layers have an inverted wedge shape in a left outer portion and in a bottom outer portion relative to a center of the memory cell array layers.

9. The stacked semiconductor memory device of claim 1, wherein the memory cell array layers have an inverted wedge shape in a left outer portion, in a right outer portion, in a lower outer portion and in an upper outer portion relative to a center of the memory cell array layers.

10. The stacked semiconductor memory device of claim 1, wherein each of the memory cell array layers comprises a plurality of memory blocks divided by a VIA region in which vertical connection lines are arranged.

11. The stacked semiconductor memory device of claim 10, wherein redundant cell arrays of the same type are disposed on opposite surfaces of two memory blocks divided by the VIA region.

12. The stacked semiconductor memory device of claim 1, wherein layer addresses of memory cell array layers in the same block as a memory cell array layer having a defective cell are substituted with new layer addresses.

13. The stacked semiconductor memory device of claim 12, wherein a layer address of the memory cell array layer having the defective cell is substituted with a most significant address.

14. The stacked semiconductor memory device of claim 12, wherein each of the new layer addresses is generated by performing an exclusive NOR (XNOR) operation on one of the memory cell array layers and an address of the memory cell array layer having the defective cell.

15. The stacked semiconductor memory device of claim 12, wherein a block redundant cell array region for repairing the memory cell array layer having the defective cell is disposed in a peripheral region of each of the memory cell array layers.

16. The stacked semiconductor memory device of claim 1, further comprising:
    a memory controller configured to generate address signals and command signals,
    wherein the memory cell array layers store received data or output stored data based on the address signals and the command signals.

17. A method of repairing a stacked semiconductor memory device, the memory device including memory cell array (MCA) layers stacked on a semiconductor substrate, the respective MCA layers increasing in area with distance from the semiconductor substrate such that each MCA layer provides a different amount of redundant data storage and each MCA layer includes a redundant row memory cell array and a redundant column memory cell array, the method comprising:
    repairing defective memory cells included in one MCA layer among the MCA layers using the redundant row memory cell array and the redundant column memory cell array of the one MCA layer; and
    substituting layer addresses of other MCA layers belonging to a same block as the one MCA layer including the defective memory cells with respective, new layer addresses.

18. The method of claim 17, wherein substituting layer addresses of the other MCA layers with respective, new layer addresses comprises:

for each one of the other MCA layers, performing an exclusive NOR (XNOR) operation on an address of the MCA layer and an address of the one MCA layer including the defective memory cells.

19. A method of repairing a stacked semiconductor memory device, the memory device including memory cell array (MCA) layers stacked on a semiconductor substrate, the respective MCA layers increasing in area with distance from the semiconductor substrate such that each MCA layer provides a different amount of redundant data storage and each MCA layer includes a redundant row memory cell array and a redundant column memory cell array, the method comprising:

repairing defective memory cells included in one MCA layer among the MCA layers using at least one of a redundant row memory cell array and a redundant column memory cell array disposed in a peripheral region of one of the MCA layers.

20. The method of claim 19, wherein the peripheral region is a peripheral region of the one MCA layer.

* * * * *